(12) United States Patent
Park (10) Patent No.: US 8,809,977 B2
(45) Date of Patent: Aug. 19, 2014

(54) SEMICONDCUTOR DEVICE AND METHOD FOR FABRICATING THE SAME

(75) Inventor: Ji Ho Park, Changwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 93 days.

(21) Appl. No.: 13/331,371

(22) Filed: Dec. 20, 2011

(65) Prior Publication Data

US 2013/0037892 A1 Feb. 14, 2013

(30) Foreign Application Priority Data

Aug. 10, 2011 (KR) .................. 10-2011-0079600

(51) Int. Cl.
*H01L 29/82* (2006.01)

(52) U.S. Cl.
USPC .......................................... 257/421

(58) Field of Classification Search
USPC .......................................... 257/422
See application file for complete search history.

(56) References Cited

U.S. PATENT DOCUMENTS

| | | | | |
|---|---|---|---|---|
| 6,387,549 B1 * | 5/2002 | Obata et al. | ................ | 428/810 |
| 6,621,730 B1 * | 9/2003 | Lage | ................ | 365/158 |
| 6,838,740 B2 * | 1/2005 | Huai et al. | ................ | 257/421 |
| 7,221,584 B2 * | 5/2007 | Liu et al. | ................ | 365/158 |
| 7,242,067 B1 * | 7/2007 | Signorini | ................ | 257/421 |
| 7,344,896 B2 * | 3/2008 | Leuschner et al. | ................ | 438/3 |
| 7,781,231 B2 * | 8/2010 | Li | ................ | 438/3 |
| 2001/0022373 A1 * | 9/2001 | Minakata et al. | ................ | 257/295 |
| 2004/0183151 A1 * | 9/2004 | Flatte et al. | ................ | 257/421 |
| 2004/0262627 A1 * | 12/2004 | Doerner et al. | ................ | 257/104 |
| 2007/0007610 A1 * | 1/2007 | Saito et al. | ................ | 257/422 |
| 2007/0264728 A1 * | 11/2007 | Miura et al. | ................ | 438/3 |
| 2008/0164547 A1 * | 7/2008 | Higo et al. | ................ | 257/421 |
| 2010/0032777 A1 * | 2/2010 | Gao et al. | ................ | 257/421 |
| 2010/0032778 A1 * | 2/2010 | Lu et al. | ................ | 257/421 |
| 2010/0176472 A1 * | 7/2010 | Shoji | ................ | 257/421 |
| 2011/0140218 A1 * | 6/2011 | Drewes | ................ | 257/422 |
| 2011/0210410 A1 * | 9/2011 | Ding et al. | ................ | 257/422 |
| 2011/0233697 A1 * | 9/2011 | Kajiyama | ................ | 257/421 |
| 2012/0061783 A1 * | 3/2012 | Anderson et al. | ................ | 257/421 |
| 2012/0161263 A1 * | 6/2012 | Maat et al. | ................ | 257/422 |
| 2012/0161264 A1 * | 6/2012 | Hong et al. | ................ | 257/422 |
| 2012/0299134 A1 * | 11/2012 | Jan et al. | ................ | 257/421 |
| 2012/0300540 A1 * | 11/2012 | Liu et al. | ................ | 365/158 |
| 2012/0319221 A1 * | 12/2012 | Apalkov et al. | ................ | 257/427 |
| 2013/0077378 A1 * | 3/2013 | Kramer et al. | ................ | 365/145 |

* cited by examiner

*Primary Examiner* — Yu-Hsi D Sun
*Assistant Examiner* — Grant Withers
(74) *Attorney, Agent, or Firm* — IP & T Group LLP (57) ABSTRACT

A semiconductor device includes a pinned layer having a magnetic direction permanently set to a first direction, a tunnel insulating layer arranged on the pinned layer, a free layer arranged on the tunnel insulating layer and having a changeable magnetic direction, and a magnetic induction layer formed to surround the pinned layer and have a magnetic direction permanently set to a second direction different from the first direction.

14 Claims, 9 Drawing Sheets

SEMICONDCUTOR DEVICE AND METHOD FOR FABRICATING THE SAME

CROSS-REFERENCE(S) TO RELATED APPLICATIONS

The present application claims priority of Korean Patent Application No. 10-2011-0079600, filed on Aug. 10, 2011, which is incorporated herein by reference in its entirety.

BACKGROUND OF THE INVENTION

The present invention relates to a semiconductor device and a method for fabricating the semiconductor device, and more particularly to a semiconductor apparatus including a magneto-resistance device in which a pinned layer having a polarity formed in a vertical magnetic direction is included.

A memory device for storing data may be used in a computer, a mobile device, a broadcast system, instructional devices, game devices, and so on.

Since memory devices were first introduced, a storage capability of memory device has been increasing quadruple every 2 to 3 years.

Recently, a non-volatile semiconductor memory device has been developed to allow easier access (e.g., operation speed). For example, a spin-transfer torque random access memory (STT-RAM) has been developed. The STT-RAM, which is a type of magneto-resistance random memory device (MRAM), uses an element having a magneto-resistance that depends on quantum mechanics effect for storing data, where the STT-RAM has non-volatility and high operation speed.

In order to store information, the STT-RAM uses a Magnetic Tunnel Junction (MTJ). The MTJ generally includes a stacked structure of a lower electrode, a pinned layer, an insulating layer, a free layer, and an upper electrode. Depending on magnetic directions of the pinned layer and the free layer, a magneto-resistance (MR) of the MTJ is changed. The STT-RAM detects changes of the magneto-resistance to recognize whether a stored data is a logic level of 1 or 0.

The MTJ can be divided into a horizontal type and a vertical type according to its magnetic direction. Because the vertical type of MTJ has a vertical magnetic direction, a plan area of the MTJ can be smaller than that of the horizontal type. If the vertical type of MTJ is applied to a STT-RAM, scalability of the memory device can be improved.

SUMMARY OF THE INVENTION

An embodiment of the present invention is directed to a semiconductor device including a magneto-resistive storage element which forms a vertical magnetic direction and minimizes/reduces effect of stray field to allow a symmetric switching and a method for fabricating the semiconductor device.

In accordance with an embodiment of the present invention, a semiconductor device includes a pinned layer having a magnetic direction permanently set to a first direction, a tunnel insulating layer arranged on the pinned layer, a free layer arranged on the tunnel insulating layer and having a changeable magnetic direction, and a magnetic induction layer formed to surround the pinned layer and have a magnetic direction permanently set to a second direction different from the first direction.

In accordance with another embodiment of the present invention, a semiconductor device includes a pinned layer having a magnetic direction permanently set to a first direction, a tunnel insulating layer arranged on the pinned layer, a free layer arranged on the tunnel insulating layer, and the magnetic induction layer formed to surround the pinned layer with a space and have a magnetic direction set to a second direction opposite from the first direction.

In accordance with another embodiment of the present invention, a method for fabricating a semiconductor device includes forming a pinned layer, a tunnel insulating layer, a free layer, a first conducting layer, and a mask pattern, etching the first conducting layer by using the make pattern as an etch barrier, etching the free layer, the tunnel insulating layer and the pinned layer by using the etched first conducting layer as an etch barrier, forming a spacer pattern at sides of the etched first conducting layer, free layer, tunnel insulting layer and pinned layer, and forming a magnetic induction layer to surround the spacer pattern connected to the pinned layer.

DESCRIPTION OF SPECIFIC EMBODIMENTS

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
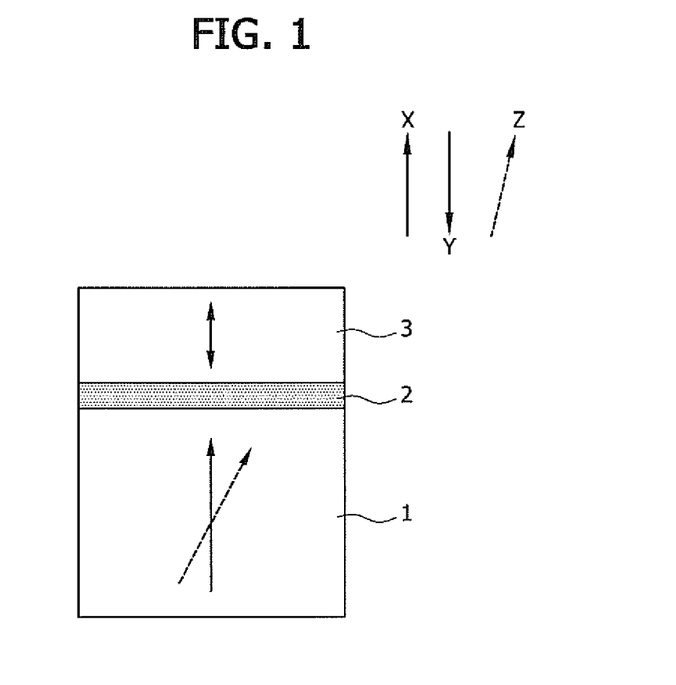
FIG. 1 is a block diagram showing a vertical-type magneto-resistive storage element.

FIG. 1 is a block diagram showing a vertical-type magneto-resistive storage element.

As shown, the vertical-type magneto-resistive storage element includes a vertical pinned layer 1, a tunnel insulating layer 2, and a vertical free layer 3. The vertical free layer 3 has a magnetic direction which is changeable to a first direction X or a second direction Y. The vertical pinned layer 1 has a magnetic direction set to the first direction X. However, when the vertical pinned layer 1 is formed, the crystal orientation of a thin layer used as the vertical pinned layer 1 can be set to [111], not [001], so that the magnetic direction of the vertical pinned layer 1 may be set not to the first direction X but to a third direction Z. In this case, since magnetic directions of the vertical pinned layer 1 and the vertical free layer 3 are not equal nor opposite, a tunnel magneto-resistance TMR of the vertical-type magneto-resistive storage element may decrease.

In addition, a stray field generated from the vertical pinned layer can shift an internal magnetic field of the vertical-type magneto-resistive storage element so that a symmetric switching may be difficult. For example, characteristics such as Vc+, Vc− may be different. In order to have stable and constant characteristics, an internal magnetic field may be centered.

In the embodiment of the present invention, a magnetic direction of the pinned layer is formed vertically and an effect of stray field is minimized to allow a symmetric switching of magneto-resistive storage element.

Figure 2:
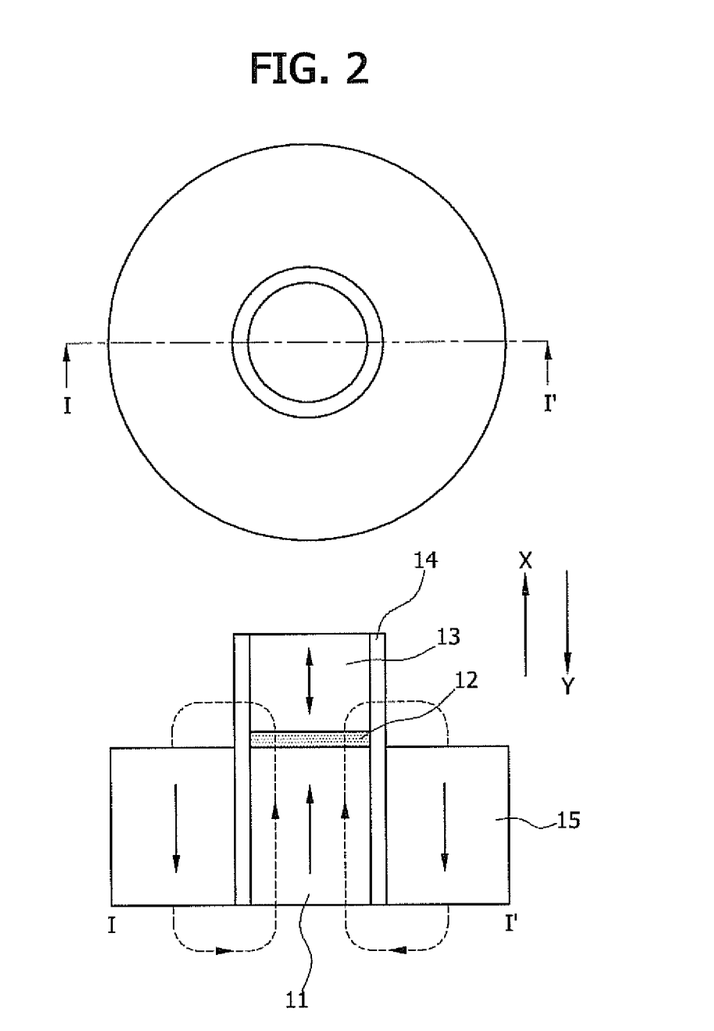
FIG. 2 is a block diagram illustrating a magneto-resistive storage element in accordance with an embodiment of the present invention.

FIG. 2 is a block diagram illustrating a magneto-resistive storage element in accordance with an embodiment of the present invention.

As shown, the magneto-resistive storage element includes a pinned layer 11, a tunnel insulating layer 12, a free layer 13, a spacer pattern 14, and a magnetic induction layer 15.

The pinned layer 11 has a magnetic direction set to a first direction X. According to an example, the magnetic direction of pinned layer 11 is formed vertically by the magnetic induction layer 15. Here, even if a crystal orientation of layer used as the pinned layer 11 is not formed as [001], the magnetic direction of the pinned layer 11 is adjusted vertically by the magnetic induction layer 15. The pinned layer 11 is a ferromagnetic layer including at least one of CoFeB, FePt, CoPt, Co/Pd, Co/Pt, Fe/Pd, Fe/Pt, CoFe/Pd and Cofe/Pt. Herein, Co/Pd means a stacked structure of a lower layer including a Pd and an upper layer including Co, or a stacked structure of Co layers that are alternately stacked with Pd layers. Further, the free layer 13 can include a rare-earth metal. Here, elements 58 to 71 in the periodic table are known as rare earth elements.

The spacer pattern 14 surrounds the pinned layer 11, the tunnel insulting layer 12 and the free layer 13 to protect each layer (11, 12 and 13). The spacer pattern includes an insulating layer. In detail, the spacer pattern includes an oxide layer or a nitride layer.

The magnetic induction layer 15 configured to control the magnetic direction of the pinned layer 11 to be vertically formed. The magnetic induction layer 15 is formed at one side or both sides of the pinned layer 11 or surrounds the pinned layer 11. A magnetic direction of magnetic induction layer 15 is set to the second direction Y, which is an opposite of the first direction X. If the magnetic directions of the pinned layer 11 and the magnetic induction layer 15 are opposite to each other, a magnetic field generated from the magnetic induction layer 15 affects that the magnetic direction of the pinned layer 11 to be vertically formed, i.e., perpendicular to a semiconductor substrate. Because of synthetic antiferromagnetic coupling, the pinned layer 11 and the magnetic induction layer 15 affect each other so that the magnetic direction of the pinned layer 11 is vertically formed. According to an example, the magnetic induction layer 15 may be a ferromagnetic layer including at least one of CoFeB, FePt, CoPt, Co/Pd, Co/Pt, Fe/Pd, Fe/Pt, CoFe/Pd and Cofe/Pt. Herein, Co/Pd means a stacked structure of a lower layer including a Pd and an upper layer including Co or a stacked structure of Co layers that are alternately stacked with Pd layers. Further, the magnetic induction layer 15 can include a rare-earth metal. According to an example, the pinned layer 11 and the magnetic induction layer 15 are not formed with the same material because, if the two layers 11 and 15 include the same material, the magnetic directions of the two layers 11 and 15 can be formed in the same direction. If the magnetic induction layer 15 is formed with a different material from the pinned layer 11 and the magnetic direction of the pinned layer 11 is set, the magnetic direction of the magnetic induction layer 15 may be set to be opposite to that of the pinned layer 11.

According to an example, the height of the magnetic induction layer 15 from the bottom of the semiconductor substrate is equal to or lower than that of the pinned layer 11. If the height of the magnetic induction layer 15 is higher than that of the pinned layer 11, the magnetic induction layer 15 can affect the free layer 13. According to an example, the height of the magnetic induction layer 15 is the same as the height of the pinned layer 11. Also, the pinned layer 11, the tunnel insulating layer 12, the free layer 13, the spacer pattern 14, and the magnetic induction layer 15 may each be a Co-alloy layer, a Fe-alloy layer, a CoFe-alloy layer or a multilayer.

Figure 3:
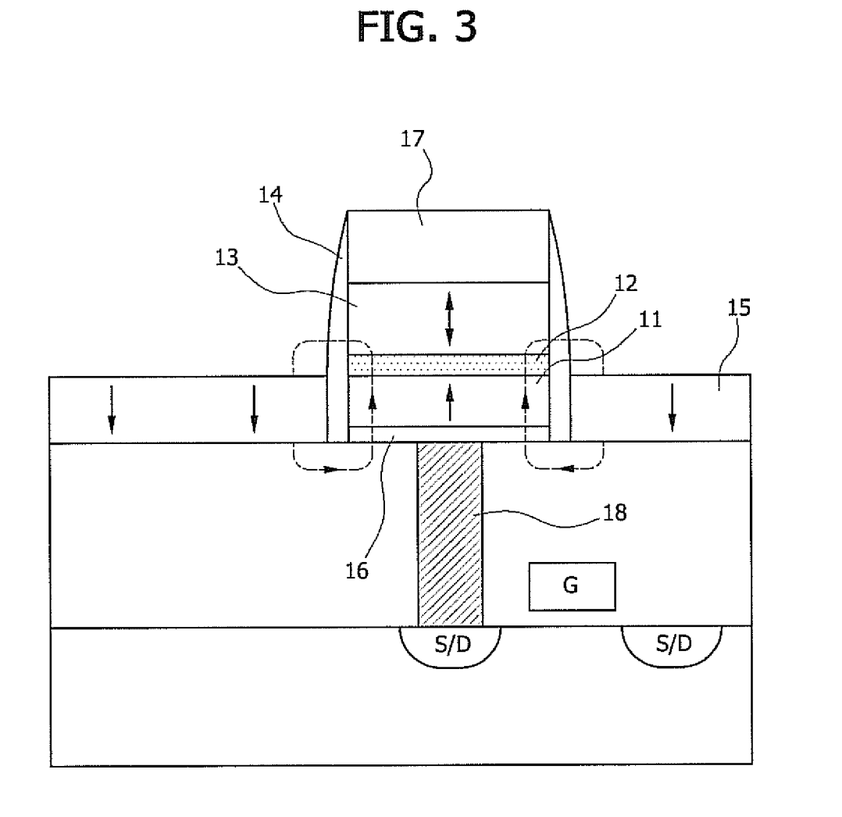
FIG. 3 is a block diagram illustrating one unit memory cell of magneto-resistive random access memory including the magneto-resistive storage element shown in FIG. 2.

FIG. 3 is a block diagram illustrating one unit memory cell of magneto-resistive random access memory including the magneto-resistive storage element shown in FIG. 2.

As shown, the unit memory cell includes one switching device and one magneto-resistive storage element. The switching device selects the magneto-resistive storage element in response to an address signal and provides a current. The switching device includes a transistor having a gate G and source/drain S/D. The magneto-resistive storage element has a similar structure shown in FIG. 2 and further includes a lower electrode 16 and an upper electrode 17. The switching device and the magneto-resistive storage element are electrically coupled through a contact plug 18.

FIGS. 4a to 4f are block diagrams illustrating a method for fabricating the unit memory cell shown in FIG. 3.

Figure 4A:
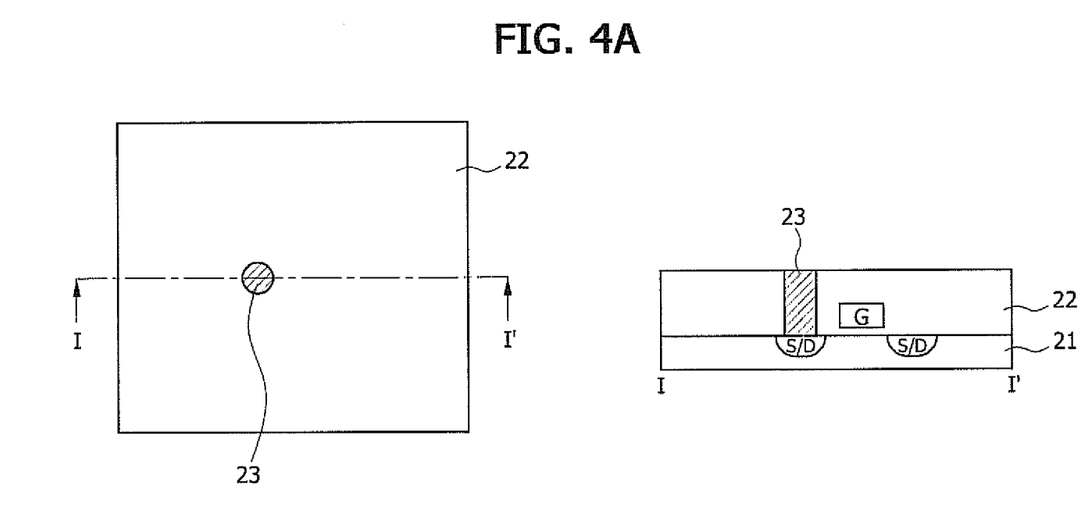
FIGS. 4a to 4f are block diagrams illustrating a method for fabricating the unit memory cell shown in FIG. 3.

Referring to FIG. 4a, a first intervening layer 22 is formed over a semiconductor substrate 21 including a transistor having a gate G and source/drain S/D. The first intervening layer 22 serves as insulating each device from other devices. The first intervening layer 22 includes an oxide layer, e.g., at least one of a borosilicate glass (BSG), a borophosphosilicate glass (BPSG), a phosphorsilicate glass (PSG), a tetraethyl orthosilicate (TEOS), a high density plasma (HDP) oxide layer, and a spin on glass (SOG) oxide layer.

A first contact plug 23 passing through the first insulating layer 22 is formed to contact the source/drain S/D of transistor. The first contact plug 23 electrically couples the transistor and the magneto-resistive storage element. The first contact plug 23 includes a conductive material.

Figure 4B:
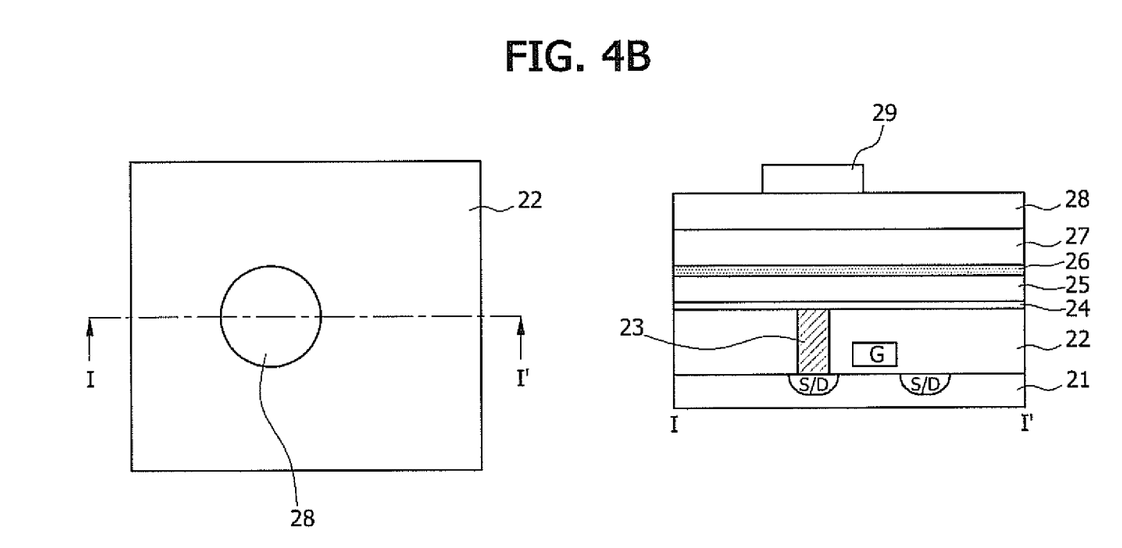

Referring to FIG. 4b, a first conductive layer 24, a first ferromagnetic layer 25, a first insulating layer 26, a second ferromagnetic layer 27, a second conductive layer 28, and a mask pattern 29 are formed over the semiconductor substrate 21 including the first contact plug 23.

The first conductive layer 24 is used for a lower electrode. The first conductive layer 24 can include at least one of Ti, W, Ta, and TiN.

The first ferromagnetic layer 25 is used for a pinned layer. The first ferromagnetic layer 25 can include at least one of CoFeB, FePt, CoPt, Co/Pd, Co/Pt, Fe/Pd, Fe/Pt, CoFe/Pd and Cofe/Pt. Herein, Co/Pd means a stacked structure of a lower layer including a Pd and a upper layer including Co, or a stacked structure of Co layers that are alternately stacked with Pd layers. Further, the first ferromagnetic layer 25 can include a rare-earth metal.

The first insulating layer 26 is used for a tunnel barrier. The first insulating layer 26 can include MgO. Further, the first insulating layer 26 can include a Group IV semiconductor material, or a Group IV semiconductor material with Group III or V materials such as B, P, and As.

The second ferromagnetic layer 27 is used for a pinned layer. The first ferromagnetic layer 27 can include at least one of CoFeB, FePt, CoPt, Co/Pd, Co/Pt, Fe/Pd, Fe/Pt, CoFe/Pd and Cofe/Pt. Herein, Co/Pd means a stacked structure of a lower layer including Pd and an upper layer including Co or a stacked structure of Co layers that are alternately stacked with Pd layers. Further, the first ferromagnetic layer 27 can include a rare-earth metal.

The second conductive layer 28 is used for a lower electrode. The second conductive layer 28 can include at least one of Ti, W, Ta, and TiN.

The mask pattern 29 is used as an etch barrier to form the magneto-resistive storage element. The mask pattern 29 includes a photo-resist layer.

Figure 4C:
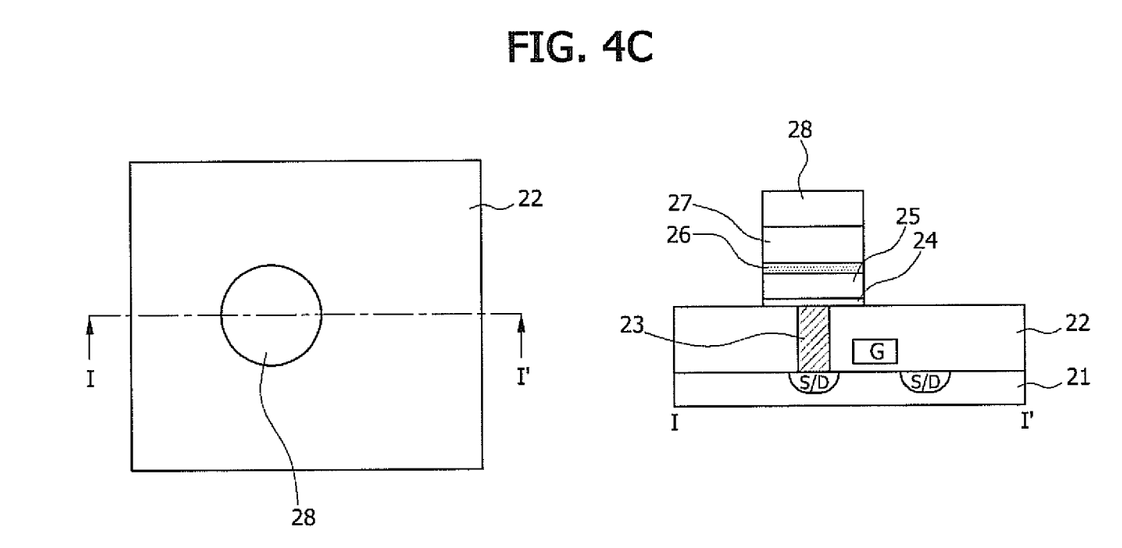

Referring to FIG. 4c, using the mask pattern 29 as an etch barrier, the second conductive layer 28, the second ferromagnetic layer 27, the first insulating layer 26, the first ferromagnetic layer 25 and the first conductive layer 24 are patterned sequentially. In detail, the mask pattern 29 is used for etching the second conductive layer 28. The patterned second conductive layer 28 is used as an etch barrier in etching the second ferromagnetic layer 27, the first insulating layer 26, the first ferromagnetic layer 25 and the first conductive layer 24. Herein, the mask pattern 29 is removed during a process to etch the second conductive layer 28 or by an additional removing process.

Figure 4D:
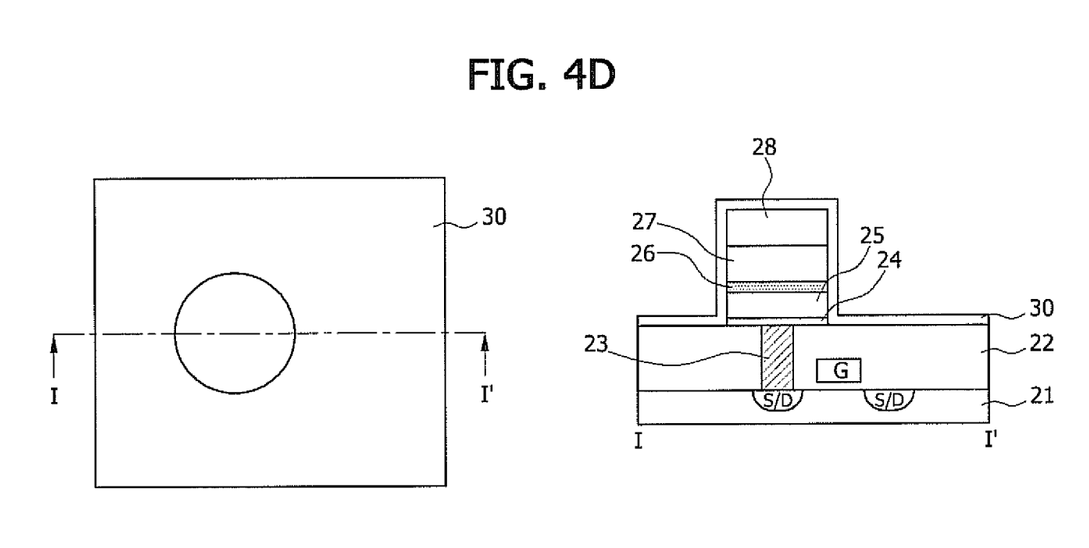

Referring to FIG. 4d, over the semiconductor substrate 21, the second insulating layer 30 is deposited. The second insulating layer 30 includes an oxide layer or a nitride layer.

Figure 4E:
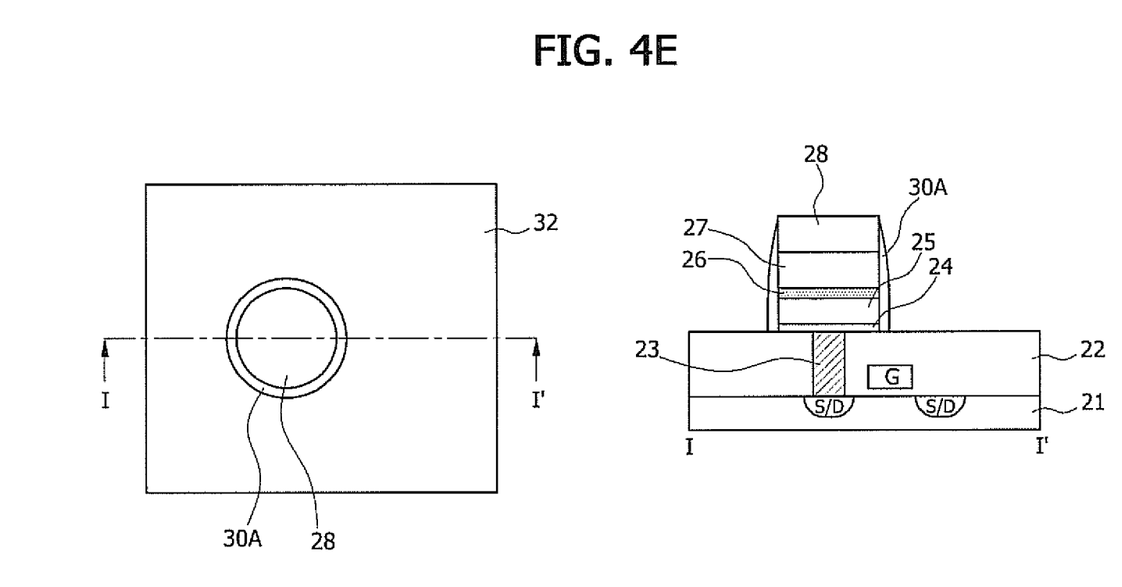

Referring to FIG. 4e, an etch-back process to the second insulating layer 30 is performed to thereby form a spacer pattern 30A. The spacer pattern 30A surrounding the pinned layer 25, the tunnel barrier 26 and the free layer 27 protects each of the layers (25, 26 and 27).

Figure 4F:
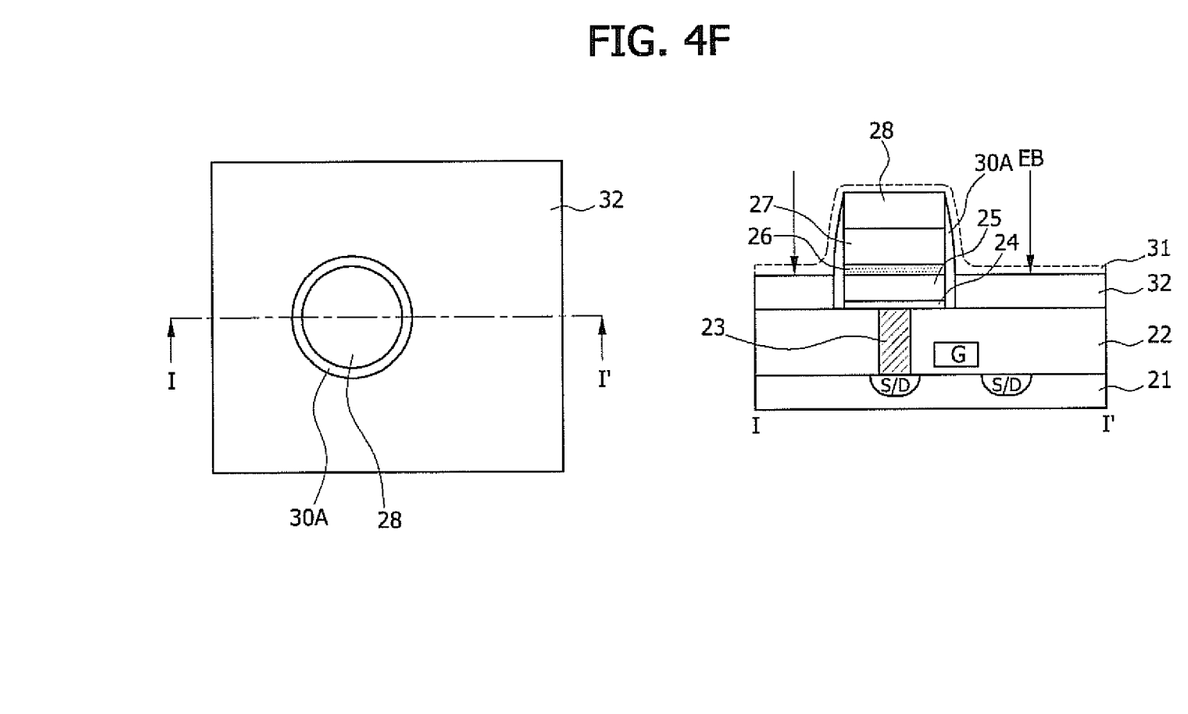

Referring to FIG. 4f, after a third ferromagnetic layer 31 is deposited over the semiconductor substrate 21, an etch-back of the third ferromagnetic layer 31 is performed to form a magnetic induction layer 32. Through above-mentioned steps, the magneto-resistive storage element can be formed.

The magnetic induction layer 32 for controlling the magnetic direction of the pinned layer 25 induces the magnetic direction of the pinned layer 25 to be formed vertically. The magnetic induction layer 32 is formed to surround the pinned layer 25. A magnetic direction of magnetic induction layer 32 is formed in an opposite direction from that of the pinned layer 25. The magnetic induction layer 32 is a ferromagnetic layer including at least one of CoFeB, FePt, CoPt, Co/Pd, Co/Pt, Fe/Pd, Fe/Pt, CoFe/Pd and Cofe/Pt. Herein, Co/Pd means a stacked structure of a lower layer including a Pd and an upper layer including Co or a stacked structure of Co layers that are alternated with Pd layers. Further, the magnetic induction layer 32 can include a rare-earth metal. According to an example, the pinned layer 25 and the magnetic induction layer 32 may not be formed with the same material because the magnetic directions of the two layers 25 and 32 can be formed in the same direction if the two layers 25 and 32 include the same material.

As discussed earlier, in accordance with embodiments of the present invention, the magneto-resistance storage element includes a magnetic induction layer covering a pinned layer. The magnetic induction layer affects a magnetic direction of the pinned layer because of synthetic antiferromagnetic coupling. According to magnetic power of the magnetic induction layer, the pinned layer has a vertical magnetic direction. Also, because the characteristics for centering the internal magnetic field of the magneto-resistance storage element grow stronger, a symmetric switching may be obtained. The magneto-resistance storage element has a high tunneling magneto-resistance (TMR) so that operational liability and stability of the magneto-resistance memory device is improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a pinned layer having a magnetic direction permanently set to a first direction;
a tunnel insulating layer arranged on the pinned layer;
a free layer arranged on the tunnel insulating layer and having a changeable magnetic direction; and
a magnetic induction layer formed to surround the pinned layer, and have a magnetic direction permanently set to a second direction different from the first direction,
wherein a height of the magnetic induction layer is equal to or lower than that of the pinned layer.

2. The semiconductor device as recited in claim 1, wherein the magnetic induction layer and the pinned layer have the same height from a bottom of a semiconductor substrate.

3. The semiconductor device as recited in claim 1, wherein the magnetic induction layer has lower height from a bottom of semiconductor substrate than the pinned layer.

4. The semiconductor device as recited in claim 1, wherein the magnetic induction layer and the pinned layer include different materials, respectively.

5. The semiconductor device as recited in claim 1, wherein the pinned layer and the magnetic induction layer each include at least one selected from the group of CoFeB, FePt, CoPt, Co/Pd, Co/Pt, Fe/Pd, Fe/Pt, CoFe/Pd and Cofe/Pt.

6. The semiconductor device as recited in claim 1, wherein the free layer includes at least one selected from the group of CoFeB, FePt, CoPt, Co/Pd, Co/Pt, Fe/Pd, Fe/Pt, CoFe/Pd and Cofe/Pt, or a rare-earth metal.

7. The semiconductor device as recited in claim 1, wherein at least one of the pinned layer, the magnetic induction layer, and the free layer includes a rare-earth metal.

8. The semiconductor device as recited in claim 1, wherein the tunnel insulating layer includes MgO.

9. The semiconductor device as recited in claim 1, further comprising a spacer pattern arranged between the pinned layer and the magnetic induction layer.

10. The semiconductor device as recited in claim 9, wherein the spacer pattern includes an insulating layer.

11. The semiconductor device as recited in claim 1, wherein the first and second directions are parallel or perpendicular to each other.

12. A semiconductor device, comprising:
a pinned layer having a magnetic direction permanently set to a first direction;
a tunnel insulating layer arranged on the pinned layer;
a free layer arranged on the tunnel insulating layer;
a magnetic induction layer formed to surround the pinned layer and have a magnetic direction set to a second direction opposite to the first direction; and
a spacer pattern arranged between the pinned layer and the magnetic induction layer, wherein the pinned layer, the tunnel insulating layer and the free layer are surrounded by the spacer pattern,
wherein a height of the magnetic induction layer is equal to or lower than that of the pinned layer.

13. The semiconductor device as recited in claim 12, wherein the magnetic induction layer and the pinned layer have the same height from a bottom of a semiconductor substrate.

14. The semiconductor device as recited in claim 12, wherein the magnetic induction layer has a lower height from a bottom of semiconductor substrate than the pinned layer.

* * * * *